(12) United States Patent
Feldman et al.

(10) Patent No.: US 8,069,016 B2
(45) Date of Patent: Nov. 29, 2011

(54) VIRTUAL DESIGNER

(75) Inventors: Steven Feldman, Cedar Park, TX (US);
Jason L. Randall, Cedar Park, TX (US);
Alexander W. Barr, Austin, TX (US);
Abhay R. Joshi, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 941 days.

(21) Appl. No.: 11/567,035

(22) Filed: Dec. 5, 2006

(65) Prior Publication Data

US 2007/0136031 A1     Jun. 14, 2007

Related U.S. Application Data

(60) Provisional application No. 60/748,630, filed on Dec. 8, 2005.

(51) Int. Cl.
*G06F 17/50*     (2006.01)
(52) U.S. Cl. .......................................... 703/1
(58) Field of Classification Search ...................... 703/1
See application file for complete search history.

(56) References Cited

U.S. PATENT DOCUMENTS

| | | | |
|---|---|---|---|
| 5,426,591 A | 6/1995 | Ginetti et al. | |
| 6,145,117 A | 11/2000 | Eng | |
| 6,249,714 B1 * | 6/2001 | Hocaoglu et al. | 700/97 |
| 6,484,182 B1 | 11/2002 | Dunphy et al. | |
| 6,684,375 B2 | 1/2004 | Tsukiyama et al. | |
| 6,769,098 B2 | 7/2004 | Tanaka et al. | |
| 6,990,649 B2 | 1/2006 | Claras | |
| 7,103,434 B2 | 9/2006 | Chernyak et al. | |
| 7,457,735 B2 * | 11/2008 | Wu et al. | 703/9 |
| 2002/0087496 A1 | 7/2002 | Stirpe et al. | |
| 2002/0138609 A1 | 9/2002 | Claras | |
| 2003/0115108 A1 | 6/2003 | Scott et al. | |
| 2003/0177018 A1 * | 9/2003 | Hughes | 705/1 |
| 2003/0191612 A1 | 10/2003 | Chang | |
| 2005/0050006 A1 | 3/2005 | Zara et al. | |

FOREIGN PATENT DOCUMENTS

EP     1 178 438     2/2002

(Continued)

OTHER PUBLICATIONS

"Customize Your Cable Assembly". RFAC Solutions, Torrence, California, USA [online], date unknown but available on the internet at least as early as Nov. 2005 [retrieved from the internet May 1, 2007], <www.rfacsolutions.com/cable-assembly.php>.

(Continued)

*Primary Examiner* — David Silver
(74) *Attorney, Agent, or Firm* — Johannes P. M. Kusters

(57) ABSTRACT

The present invention includes a method of electronically designing an article, including accessing an electronic article design system, selecting an article type to design, and iteratively configuring a group of characteristics by selecting one or more options for each characteristic and/or iteratively modeling the article performance based on a selection of one or more performance parameters for each performance model. In the iterative configuration and modeling step, the electronic article design system automatically presents the characteristics and the performance models based on the article type selected, dynamically updates the article for each step of the iterative configuration and/or modeled performance, and automatically resolves conflicts between iteratively configured characteristics, between iteratively modeled performances, and across iteratively configured characteristics and modeled performances.

18 Claims, 11 Drawing Sheets

FOREIGN PATENT DOCUMENTS

| | | |
|---|---|---|
| JP | 350821 | 12/2001 |
| JP | 302628 | 10/2004 |
| WO | WO 02/33544 | 4/2002 |

OTHER PUBLICATIONS

"Gore Adds Assemblies to Its Online Configuration Tool", W.L. Gore & Associates, Inc., Elkton, Maryland, USA [online], May 3, 2006, <www.gore.com/en_xx/news/epd_assemblies_configurator_060503.html>.

"Gore High Flex Flat Cable & Gore Trackless Cable Configurator", W.L. Gore & Associates, Inc., Elkton, Maryland, USA [online], date unknown but available on the internet at least as early as Mar. 2005 [retrieved from the internet May 1, 2007], <www.gore.com/trackless_configurator/index.jsp?xcmp=ec1>.

* cited by examiner

| time | voltage | time | ramp time | voltage | ramp time | voltage | | |
|---|---|---|---|---|---|---|---|---|
| 0 | 0 | 0.000001 | 0 | | | | dt | 1.00E-11 |
| 1.00E-11 | 0 | 0.000002 | 1.00E-11 | 0 | 1E-11 | 0 | max | 0.9928 |
| 2.00E-11 | 0 | 0.000003 | 2.00E-11 | 0 | 2E-11 | 0 | min | 0 |
| 3.00E-11 | 0 | 0.000004 | 3.00E-11 | 0 | 3E-11 | 0 | rate | |
| 4.00E-11 | 0 | 0.000005 | 4.00E-11 | 0 | 4E-11 | 0 | period | 5.00E-10 |
| 5.00E-11 | 0 | 0.000006 | 5.00E-11 | 0 | 5E-11 | 0 | 2 periods | 1.00E-09 |
| 6.00E-11 | 0 | 0.000007 | 6.00E-11 | 0 | 6E-11 | 0 | 2 period pt | 100 |
| 7.00E-11 | 0 | 0.000008 | 7.00E-11 | 0 | 7E-11 | 0 | 1st 50% | 9E-10 |
| 8.00E-11 | 0 | 0.000009 | 8.00E-11 | 0 | 8E-11 | 0 | 1st pt | 1.15E-09 |
| 9.00E-11 | 0 | 0.00001 | 9.00E-11 | 0 | 9E-11 | 0 | | |
| 1.00E-10 | 0 | 0.000011 | 1.00E-10 | 0 | 1E-10 | 0 | | |
| 1.10E-10 | 0 | 0.000012 | 1.10E-10 | 0 | 1.1E-10 | 0 | | |
| 1.20E-10 | 0 | 0.000013 | 1.20E-10 | 0 | 1.2E-10 | 0 | | |
| 1.30E-10 | 0 | 0.000014 | 1.30E-10 | 0 | 1.3E-10 | 0 | | |
| 1.40E-10 | 0 | 0.000015 | 1.40E-10 | 0 | 1.4E-10 | 0 | | |
| 1.50E-10 | 0 | 0.000016 | 1.50E-10 | 0 | 1.5E-10 | 0 | | |
| 1.60E-10 | 0 | 0.000017 | 1.60E-10 | 0 | 1.6E-10 | 0 | | |
| 1.70E-10 | 0 | 0.000018 | 1.70E-10 | 0 | 1.7E-10 | 0 | | |
| 1.80E-10 | 0 | 0.000019 | 1.80E-10 | 0 | 1.8E-10 | 0 | | |
| 1.90E-10 | 0 | 0.00002 | 1.90E-10 | 0 | 1.9E-10 | 0 | | |
| 2.00E-10 | 0 | 0.000021 | 2.00E-10 | 0 | 2E-10 | 0 | | |
| 2.10E-10 | 0 | 0.000022 | 2.10E-10 | 0 | 2.1E-10 | 0 | | |
| 2.20E-10 | 0 | 0.000023 | 2.20E-10 | 0 | 2.2E-10 | 0 | | |
| 2.30E-10 | 0 | 0.000024 | 2.30E-10 | 0 | 2.3E-10 | 0 | | |
| 2.40E-10 | 0 | 0.000025 | 2.40E-10 | 0 | 2.4E-10 | 0 | | |
| 2.50E-10 | 0 | 0.000026 | 2.50E-10 | 0 | 2.5E-10 | 0 | | |
| 2.60E-10 | 0 | 0.000027 | 2.60E-10 | 0 | 2.6E-10 | 0 | | |
| 2.70E-10 | 0 | 0.000028 | 2.70E-10 | 0 | 2.7E-10 | 0 | | |
| 2.80E-10 | 0 | 0.000029 | 2.80E-10 | 0 | 2.8E-10 | 0 | | |
| 2.90E-10 | 0 | 0.00003 | 2.90E-10 | 0 | 2.9E-10 | 0 | | |
| 3.00E-10 | 0 | 0.000031 | 3.00E-10 | 0 | 3E-10 | 0 | | |
| 3.10E-10 | 0 | 0.000032 | 3.10E-10 | 0 | 3.1E-10 | 0 | | |
| 3.20E-10 | 0 | 0.000033 | 3.20E-10 | 0 | 3.2E-10 | 0 | | |

FIG. 7

VIRTUAL DESIGNER

CROSS-REFERENCE TO RELATED APPLICATION(S)

This application claims priority to and incorporates herein by reference U.S. Provisional Application Ser. No. 60/748,630, filed Dec. 8, 2005 and entitled "Virtual Designer."

BACKGROUND

The present invention relates to a method of electronic design or identification.

A variety of methods of electronic design have emerged in recent years. Systems employing these methods range from electronic design of electrical circuits, to mechanical parts or assemblies to computer networks. Such electronic design systems employ a variety of technologies in their implementation, including various software-programming languages, relational databases or other data storage and retrieval mechanisms, and user interfaces. Prior electronic design systems are delivered to users by a variety of means, such as Internet based applications including server-side storage and processing and client-side delivery via a web browser or locally stored and processed client applications. Design and build websites, offered by various commercial vendors, are well known examples of prior art systems employing electronic design methods.

SUMMARY

While existing electronic design systems and methods provide a number of useful functions, these systems do not yet provide a method of drag-and-drop iterative design, which includes configuration of design characteristics and modeling of performance results to arrive at a particular design. Additionally, existing systems do not include a means of reverse engineering a design by inputting a desired performance result to arrive at a design that produces that result. In short, existing methods and systems do not provide a bi-directional iterative method of electronic design, which includes configuring design characteristics and modeling performance results to arrive at a design for producing such results.

The present invention is a method of electronically designing an article, including accessing an electronic article design system, selecting an article type to design, and iteratively configuring a group of characteristics by selecting one or more options for each characteristic and/or iteratively modeling the article performance based on a selection of one or more performance parameters for each performance model. In the iterative configuration and modeling step, the electronic article design system automatically presents the characteristics and the performance models based on the article type selected, dynamically updates the article for each step of the iterative configuration and/or modeled performance, and automatically resolves conflicts between iteratively configured characteristics, between iteratively modeled performances, and across iteratively configured characteristics and modeled performances.

The method of the present invention is bi-directional, thereby enabling electronic design of articles by first inputting performance results for an unknown design configuration and then designing an article to achieve the one or more performance results. In some embodiments of the present invention, a method of electronically designing an article includes accessing an electronic article design system, selecting an article type to design, inputting multi-variable design data for the article type selected, and designing one or more articles with one or more characteristics based on an algorithmic match between the design data input and design data stored for articles of the selected type.

The present invention may also be adapted to electronic object or concept identification methods. A method of electronically identifying an object includes accessing an electronic object identification system, selecting an object type to identify, inputting object characteristics for the object type selected, and identifying one or more objects based on an algorithmic match between the object characteristics input to object characteristics stored for objects of the selected type.

The above summary of the present invention is not intended to describe each disclosed embodiment or every implementation of the present invention. The Figures and detailed description that follow below more particularly exemplify illustrative embodiments.

BRIEF DESCRIPTION OF THE DRAWINGS

FIG. 7 is a captured display showing a data table related to an eye diagram for an electronically designed cable assembly.

DETAILED DESCRIPTION

Glossary

The following glossary defines the meanings of certain words or combinations of words as used in this specification.

Characteristics: one or more variables upon which a particular electronic design or identification depends, for example, physical characteristics of a cable assembly, such as cable length, connector types, boardmount connectors, carriers, polarizing keys, or retainers. Another example of characteristics may be physical characteristics of a bird, including wingspan, wing shape, or beak type.

Options: selections made to define a single characteristic, for example, selecting a cable length of 22 inches or selecting wing shape from a group of different shapes.

Performance models: electronically simulated tests of a design, for example, modeling the attenuation of a cable assembly over its length or modeling the eye diagram for a cable assembly.

Performance parameters: variables upon which each performance model depends, for example, an eye diagram model depends on data rate, signal rise time, signal amplitude and cable length.

Performance results: numeric, textual, and/or graphical results of a performance model. Design data: one or more variables used to define, partially or completely, a finished design, including characteristics and performance results.

For example, design data for a cable assembly could include cable length, system impedance, and eye diagram results.

Figure 1:
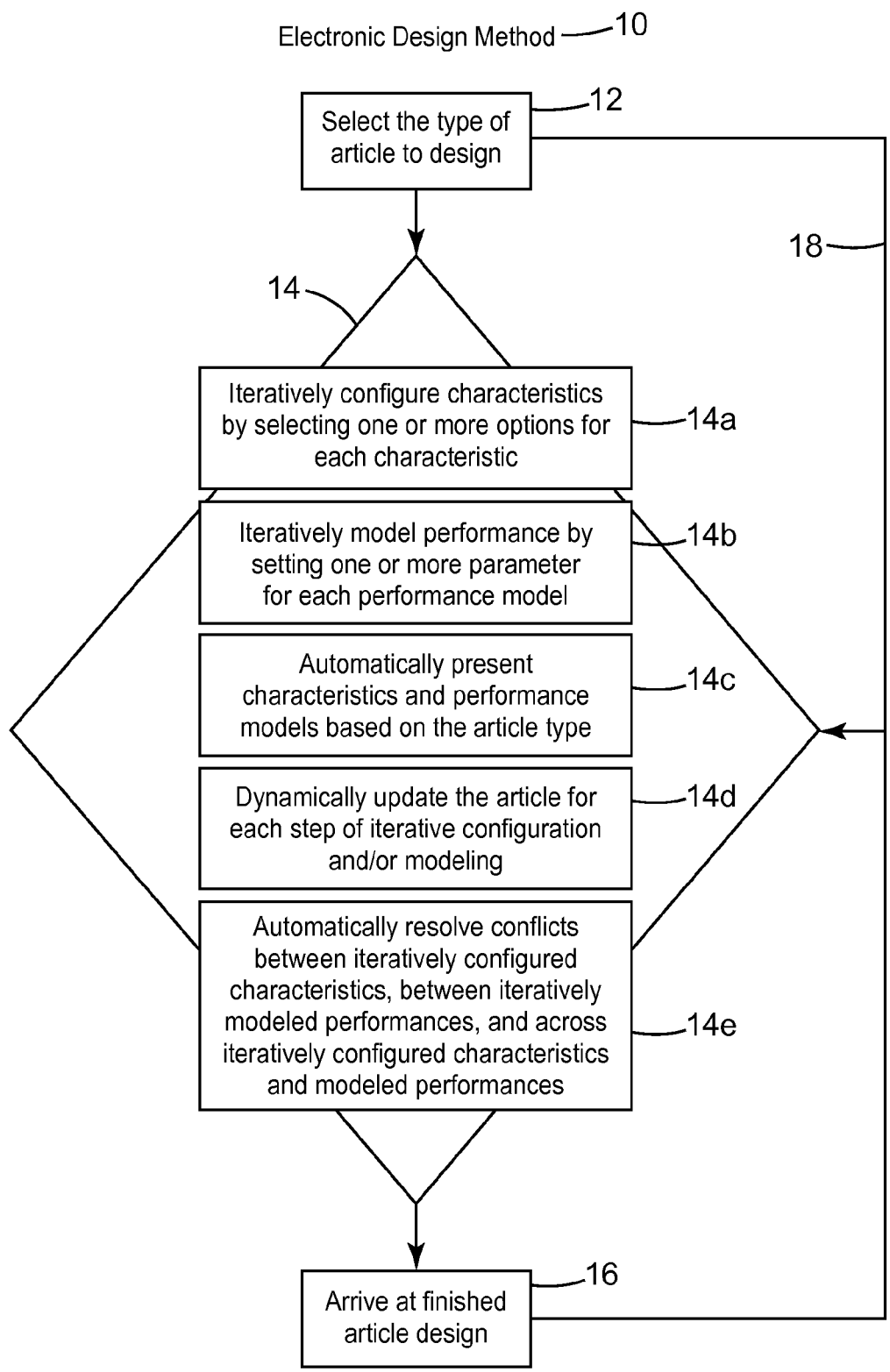
FIG. 1 is a flow diagram illustrating a method of electronically designing an article.

FIG. 1 shows an electronic article design method (10), which includes the steps of selecting the type of article to design (12), iteratively designing an article of the selected type (14), and arriving at a finished article design (16). In the embodiment of FIG. 1, the electronic design method (10) begins by selecting the type of article to design (12). The article type may be selected from a static list of available article types. Alternatively, the article type may be selected by specifying the application or intended use of the article and then choosing from a list of articles appropriate for the specified application or use. For example, in a system for designing cable assemblies, the cable assembly type may be selected by specifying balanced or unbalanced signal transmission, or by specifying an intended use, such as raintight, autoclave, deep well, avionics, or automotive. After selecting the type of article to design, an article of the selected type is iteratively designed (14), which includes iteratively configuring characteristics of the article (14a), iteratively modeling the article performance (14b), automatically presenting characteristics and performance models (14c), dynamically updating the article for each iterative configuration and performance model (14d), and automatically resolving conflicts between iterative configurations and performance models (14e).

Iteratively configuring characteristics (14a) of the article includes one or more loops of selecting different options for each characteristic. Similarly, designing the article (14) includes iteratively modeling the article performance (14b) by selecting different performance parameters for each performance model. Configuring characteristics (14a) of the article and modeling the article performance (14b) may be performed in any order, and includes one or more iterative loops through each respective characteristic configuration or performance model or between successive characteristic configurations and performance models.

In addition to configuring characteristics (14a) and modeling performance (14b), designing the article (14) includes automatically presenting the characteristics and performance models (14c) available for the type of article selected. Automatically presenting the available characteristics and performance models (14c) is ongoing through multiple loops of characteristic configurations (14a) and performance models (14b), and successively reevaluates the available characteristics and performance models based on previous iterations. Iteratively designing the article (14) also includes dynamically updating the article (14d) by virtually building the article with each iterative characteristic configuration (14a) and modeled performance (14b). Finally, designing the article (14) includes automatically resolving conflicts (14e) created during iterative characteristic configurations (14a) and performance models (14b). Conflicts are automatically resolved between iteratively configured characteristics (14a), between iteratively modeled performances (14b), and across iteratively configured characteristics and modeled performances. The electronic design method (10) concludes by arriving at a finished article design (16). However, a feedback loop (18) enables the selection step (12) and the iterative article design step (14) to be repeated as necessary to arrive at multiple article designs, to refine a single article design, or to arrive at an article design that is a best fit or closest match to the configured characteristics and/or modeled performances.

The electronic design method (10) may also include outputting electronic data related to the finished article design. The electronic data can be written to a file, spooled to a printer or sent as data to another system. The type of output data may be selected and may include, for example, technical data sheets, which are dynamically revised to match the finished article design, solid models of the finished article design, performance results, or a record of configured characteristics and/or parameters from performance models. Another output may be accuracy, for example of a modeled performance, based on a statistical analysis of the known accuracy of the algorithms used to perform a particular model. Still another output could be the solution algorithms themselves when they are not proprietary.

Figure 2:
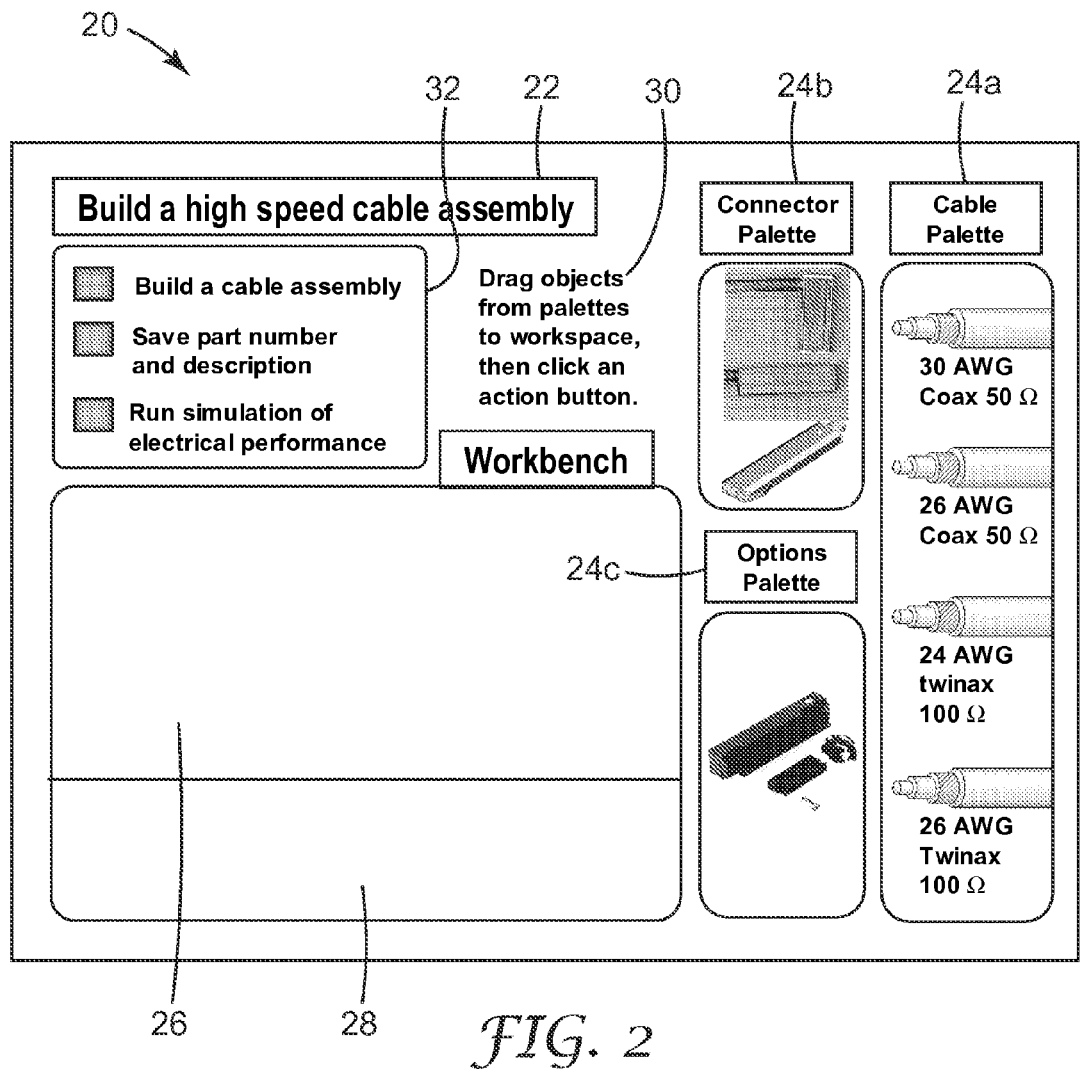
FIG. 2 is captured display showing an electronic high-speed cable assembly design system employing the method of FIG. 1.

FIG. 2 shows a captured display of a software program that allows a user to electronically design a cable assembly. In FIG. 2, an example of the electronic design method shown in FIG. 1 is employed in an electronic cable assembly design system (20), which includes a main menu (22), component palettes (24a-24c), a workspace (26), an identification window (28), a help window (30), and a command menu (32). The main menu (22) is a category menu of high-level choices of the types of articles to be electronically designed. In FIG. 2, the user has selected high-speed cable assembly from the choices of low speed cable assembly and high-speed cable assembly. This selection brings up items in the component palettes (24a-24c) appropriate for high-speed cable assemblies. The component palettes (24a-24c) display components to be assembled or assigned to the cable assembly. In FIG. 2, the components displayed are cables (24a), connectors to be terminated to cables (24b), mating boardmount connectors (not shown) and optional components (24c) such as carriers, polarizing keys (not shown), retainers, etc. The component palette items can be presented as pictures and/or descriptions, or for systems configured to design or identify other types of articles, data such as sounds, coordinates, temperatures, etc.

The workspace (26) is a virtual workbench, lab, environment, etc. in which the cable assembly is designed. Items from the component palettes (24a-24c) are brought into the workspace (26) by dragging, mouse clicks, verbal command, etc. The system (20) automatically prevents bringing incompatible elements into the workspace (26). The identification window (28) is located directly below the workspace (26). As the cable assembly is electronically designed, a description of the assembly in the workspace (26) is automatically generated and displayed in the identification window (28). The description of the cable assembly design can be a written description, stock number, UPC code, skew number, etc. The help window (30) is a graphical presentation of directions, instructions, cautions and/or warnings appropriately generated based on user activity and selections. In FIG. 2, instructions are provided which explain how to move items from the component palettes (24a-24c) to the workspace (26). If incompatible selections are made, the help window (30) could be used to advise of the inappropriate choices and provide helpful suggestions. The Command menu (32) provides the user with choices of actions or activities to perform, such as Build a Cable Assembly, Save Part Number, Run Test Simulation, etc. Command menu 32 could change appropriately to facilitate offering command options for the next steps or activities in a sequence or based on prior user choices.

Figure 3:
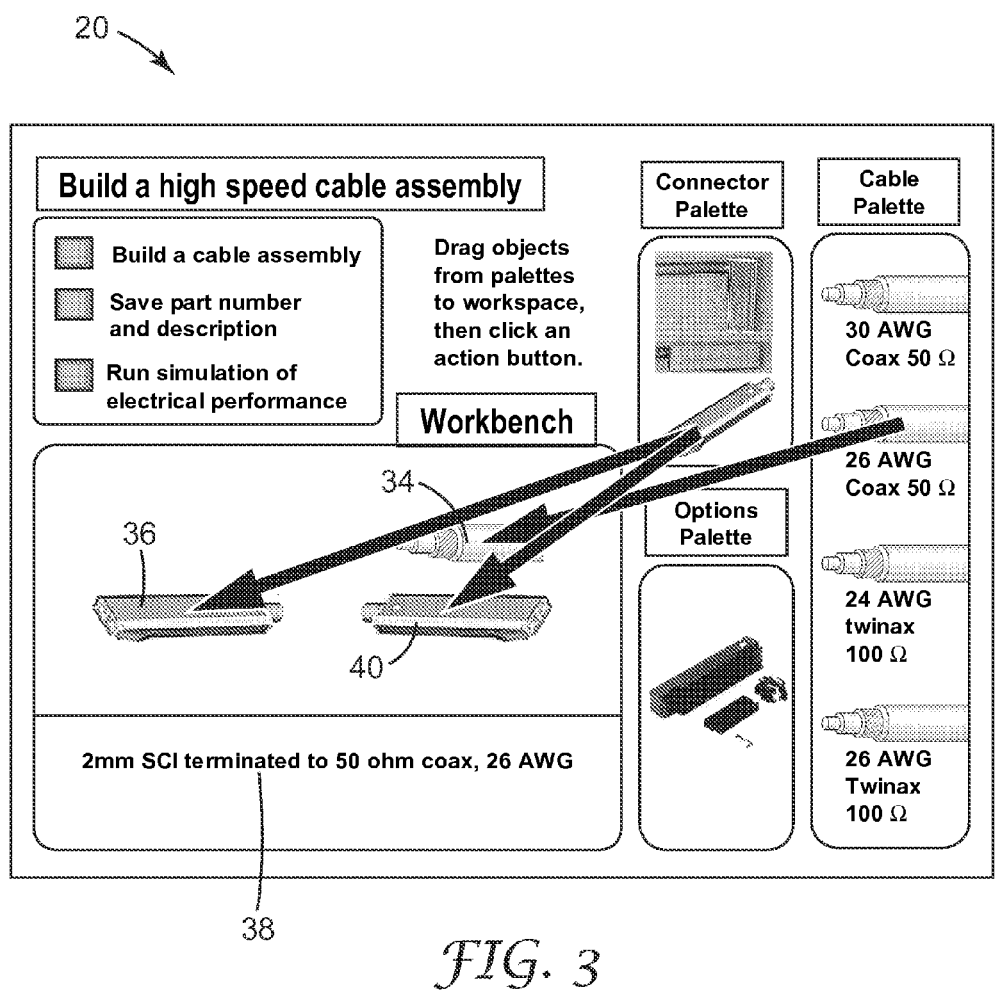
FIGS. 3-6 are captured displays illustrating user interaction with the electronic cable assembly design system of FIG. 2.

FIGS. 3-6 are captured displays illustrating user interaction with the electronic cable assembly design system (20) shown in FIG. 2. In FIG. 3, a user drags-and-drops a cable (34) and a connector (36) from the component palettes (24a, 24b) into the workspace (26) to terminate the connector (36) to one end of the cable (34). The system (20) automatically displays component descriptions (38) in the identification window (28) by retrieving and presenting textual or numeric information associated with the cable (34) and the connector (36). A second connector (40) is dragged into the workspace

(26) for termination to the opposite end of the cable (34). The system (20) automatically rotates the second connector (40) to orient it for termination to the opposite side of the cable (34). The description in the identification window (28) updates accordingly (not illustrated).

Figure 4:
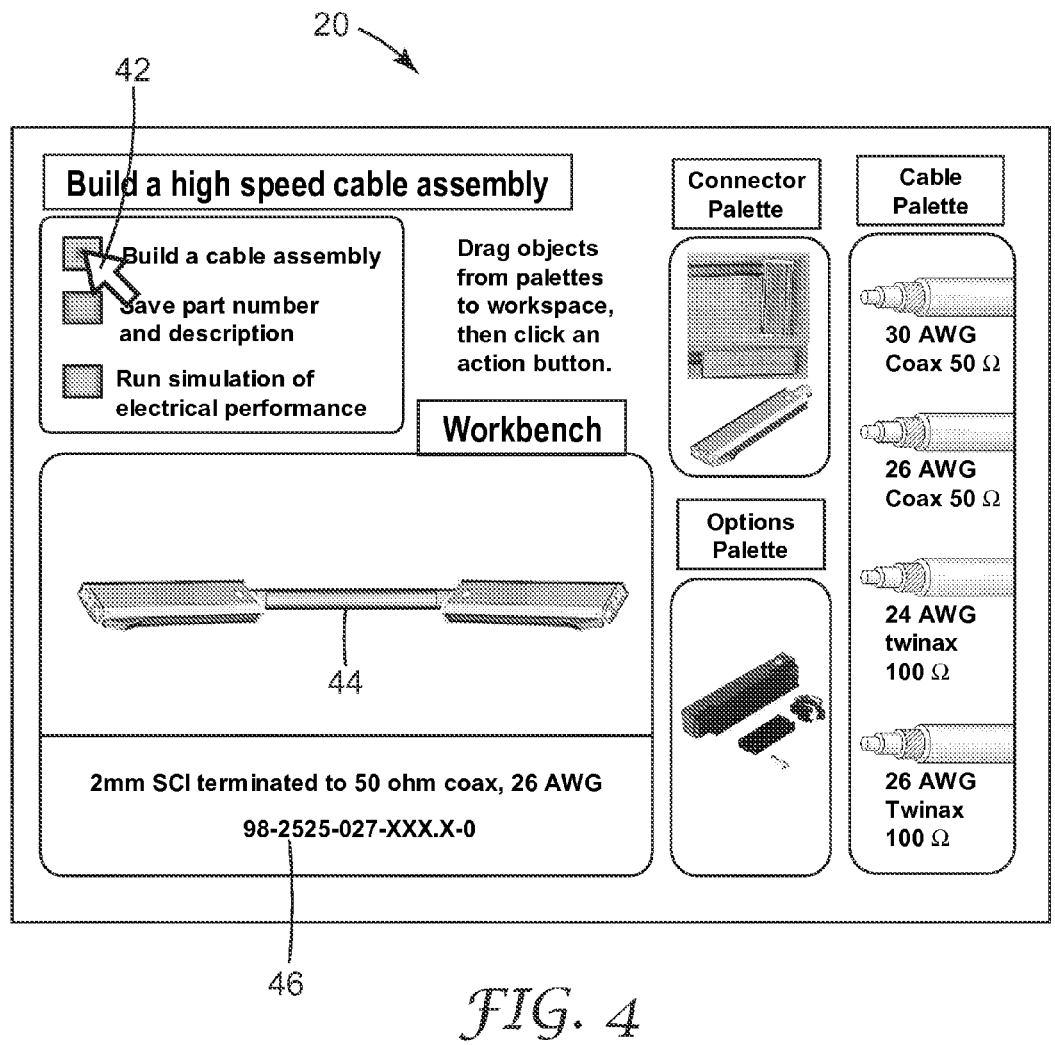

In FIG. 4, the user selects the "Build a cable assembly" option (42) from the command menu (32) (the mouse cursor is shown being clicked on the appropriate selection). This user selection signals the system (20) to virtually assemble the cable (34) and the connectors (36, 40) in the workplace (26) into a cable assembly (44). The identification window (28) displays an assembly stock number (46) in addition to the component descriptions (38). The stock number (46) contains "-XXX.X," which will change to a numeric value indicating cable assembly length when that data is input.

Figure 5:
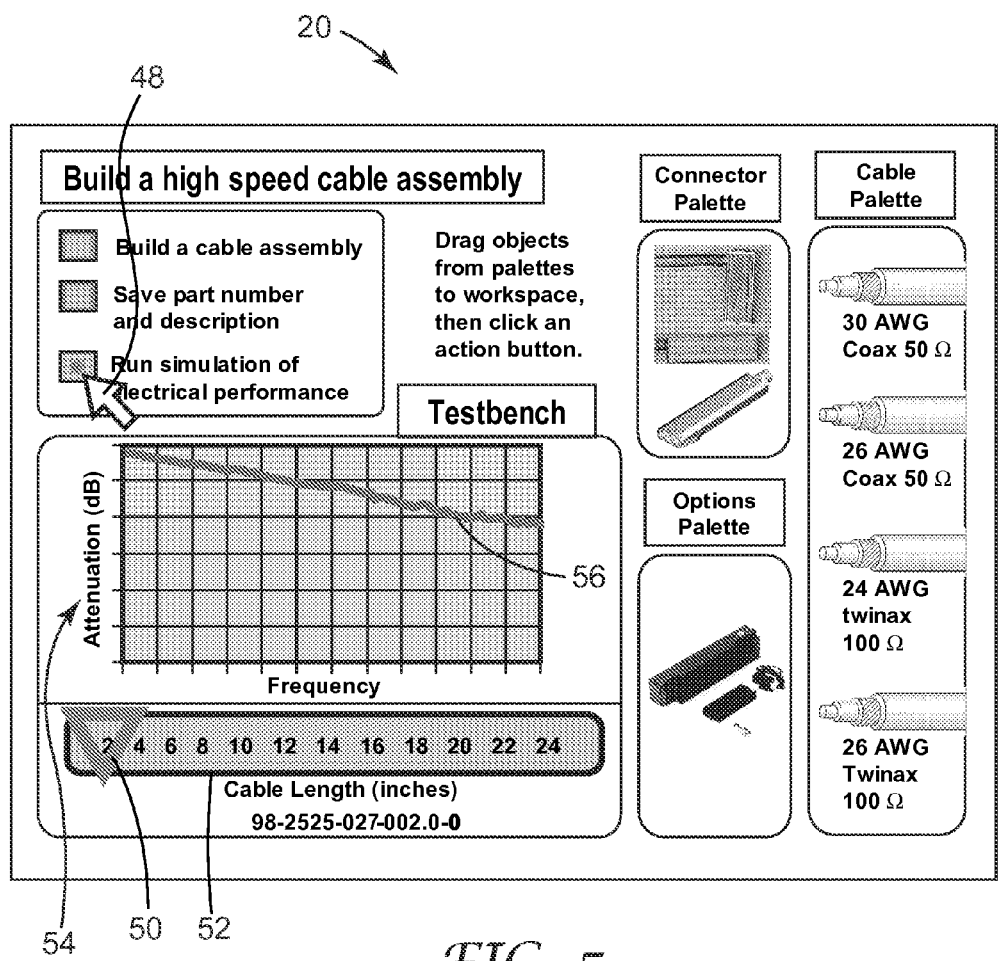
Figure 6:
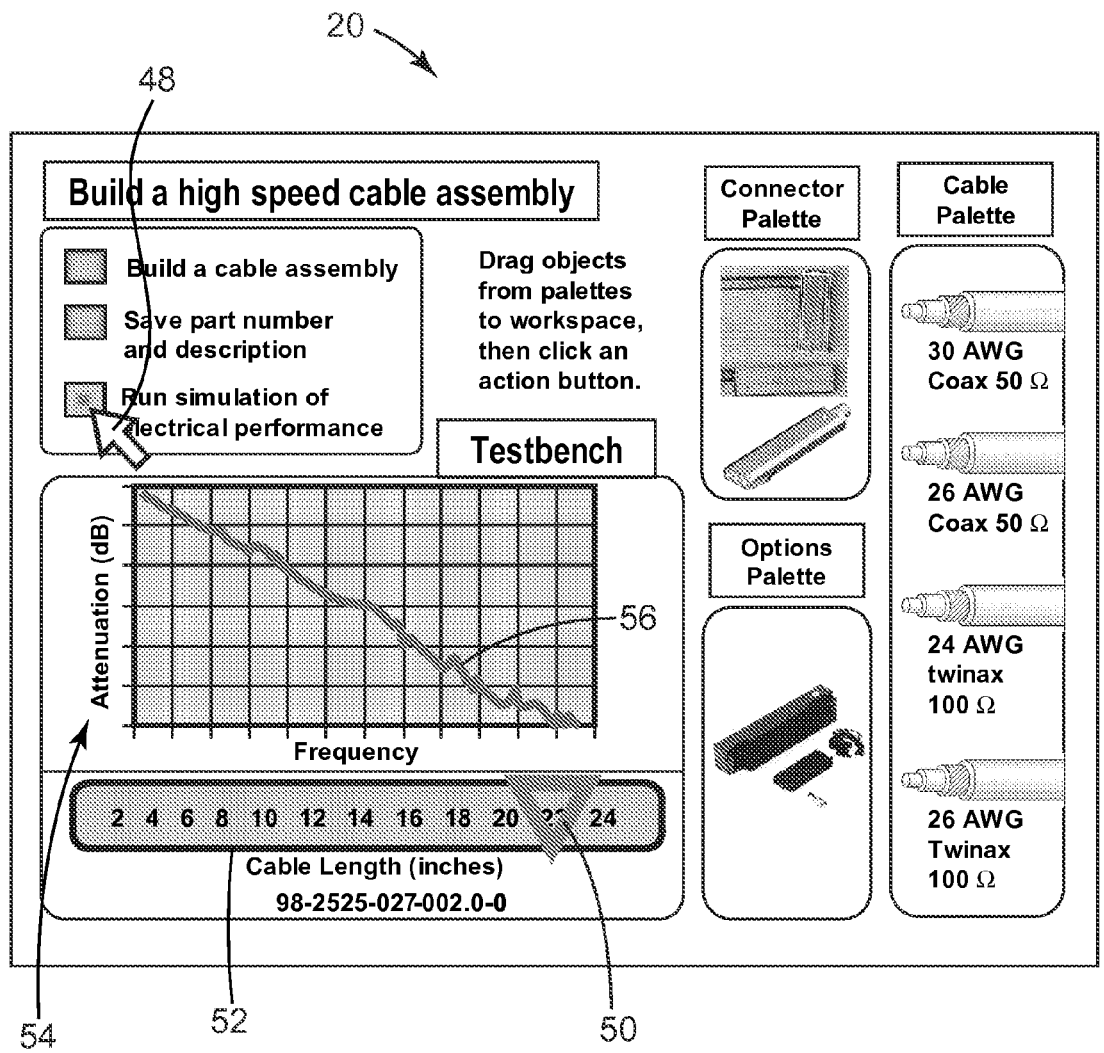

In FIGS. 5 and 6, the user selects the "Run simulation of electrical performance" option (48) from the command menu (32) (the mouse cursor is shown being clicked on the appropriate selection). The system (20) presents menus (not illustrated) which can be selected to individually display a performance model or group of performance models such as attenuation (illustrated), eye diagram, temperature and the like. Additionally, the system (20) includes mechanical and environmental test capability, such as insertion and withdrawal force, operating temperature range and the like. In FIG. 5, the user has selected attenuation as a performance model. The help window (30) displays instructions for interacting with the attenuation performance model by instructing the user to move a slider (50) along a cable length scale (52) to configure the attenuation performance model for the cable assembly (44). The user drags the cable length slider (50) to 2 inches and the system (20) dynamically models attenuation results (54). The system (20) displays the attenuation results (54) by graphing an attenuation curve (56) for a cable length of 2 inches. The system (20) also updates the stock number (46) in the identification window (28) to include the cable length portion selected by the user.

FIG. 6 shows that when the user drags the slider (50) from 2 inches to 22 inches on the cable length scale (52), the attenuation curve (56) changes in response to the longer cable length selected and the stock number (46) changes appropriately in the identification window (28). Although not illustrated in FIGS. 5 and 6, persons having ordinary skill in the art will understand that the example shown illustrates how methods according to the present invention include many examples of changing an output or performance model (attenuation in this case) through a feedback loop which changes an input or cable assembly characteristic (in this case cable length). In an alternative example, the attenuation curve is manipulated directly by selecting and moving it with the mouse cursor or other selection tool to a desired range or slope which in turn affects variables upon which the curve depends, such as cable length and even cable type previously selected from the component palette (24a). Directly changing the performance model, in this case attenuation, would also effect a change in other outputs, such as stock number in this example. The attenuation results (54), in FIG. 6, are displayed graphically, but the system (20) is capable of presenting results in a variety of formats, such as numeric or textual results.

Performance models may be run iteratively for a single cable assembly or for multiple assemblies and the user can save performance results and compare the results of one performance model to the results of a different model. For example, the user saves the attenuation results (54) for a cable length of 22 inches and compares them to results obtained on a cable assembly with the same cable length, but different connectors. The system (20) also allows the user to save performance results in a variety of data formats, thereby facilitating interoperability with other electronic systems. For example, the user saves the performance results (54) in data formats, such as SPICE, IBIS, or CITI, readable by electrical simulation software platforms available from Ansoft Corporation, Pittsburgh, Pennsylvania, U.S.A., or Agilent Technologies, Santa Clara, California, U.S.A.

Figure 8:
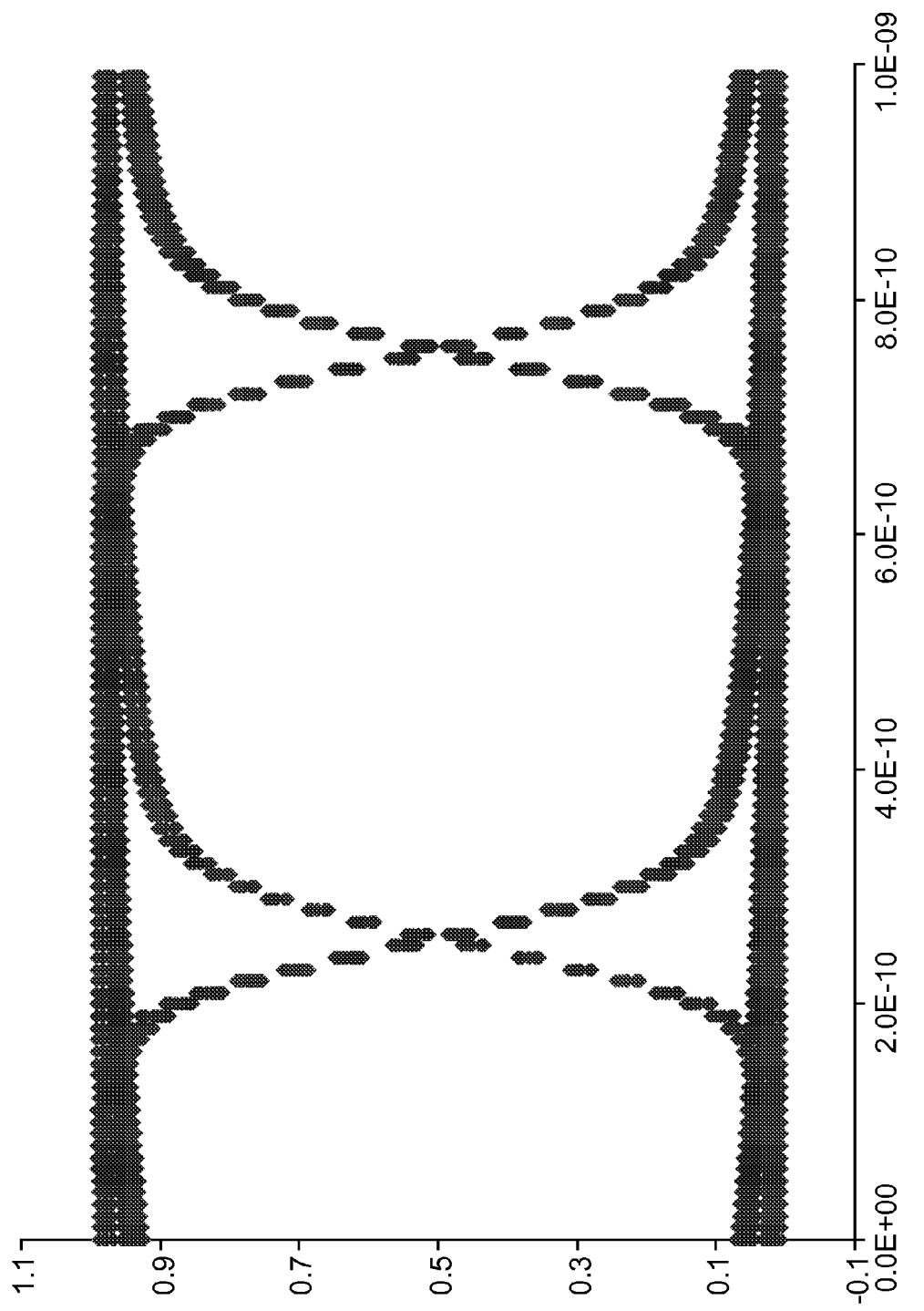
FIG. 8 is a captured display of an eye diagram generated from the data table shown in FIG. 7.

Although modeling electrical performance can be complex, requiring considerable computational overhead, simpler schemes can be used to reduce the time between configuring performance models, modeling performance, and communicating performance results. Since cable assembly characteristics and performance parameters are known in advance, several performance results generation shortcuts are contemplated. For example, the impedance profile of each connector and cable is known, allowing a chart of both to be spliced together and graphically presented as performance results. In this example, the performance result is static, meaning, the impedance profile is different for each connector and cable type but is unaffected by other cable assembly characteristics. Splicing charts for any combination of selected connector and cable is a simple set of operations. Using attenuation as an alternative example increases the computational complexity, because cable length is a variable. In this example, cable length could be made selectable in discrete steps so that each selected cable length could be matched to stored graphical attenuation performance results. Eye diagrams are an example of a still more complex performance model requiring algorithmic computations, because they require several user inputs such as data rate, signal rise time, signal amplitude and cable length. In this example, an algorithm generates a data table as shown in FIG. 7, which in turn can be charted as an eye diagram using common spreadsheet functions as shown in FIG. 8.

Persons having ordinary skill in the art will understand that methods according to the present invention include variations to the embodiment shown in FIGS. 2-8. For example, the electronic design system may include electronically designing automobiles through model and option comparisons and selections. In this alternative embodiment of the present invention, the type of automobile is selected as "SUV", "Minivan", "Midsize", or "Sport." After selecting the type of automobile, the system presents body styles within the selected category, such as 2 or 4 door, hardtop or convertible. Other characteristics include exterior and interior colors, tires and wheels, entertainment options, engine sizes and transmission types. Additional characteristics related to purchasing the automobile include buyer location, type of driving and miles driven per year. Performance models which change with article configurations might include MSRP, fair market price and dealerships based on selected location, fuel economy based on engine, transmission selections and type of driving, safety, turning radius, acceleration and braking based on model and body style configurations, and maintenance cost based on model, options and miles driven per year.

Figure 9:
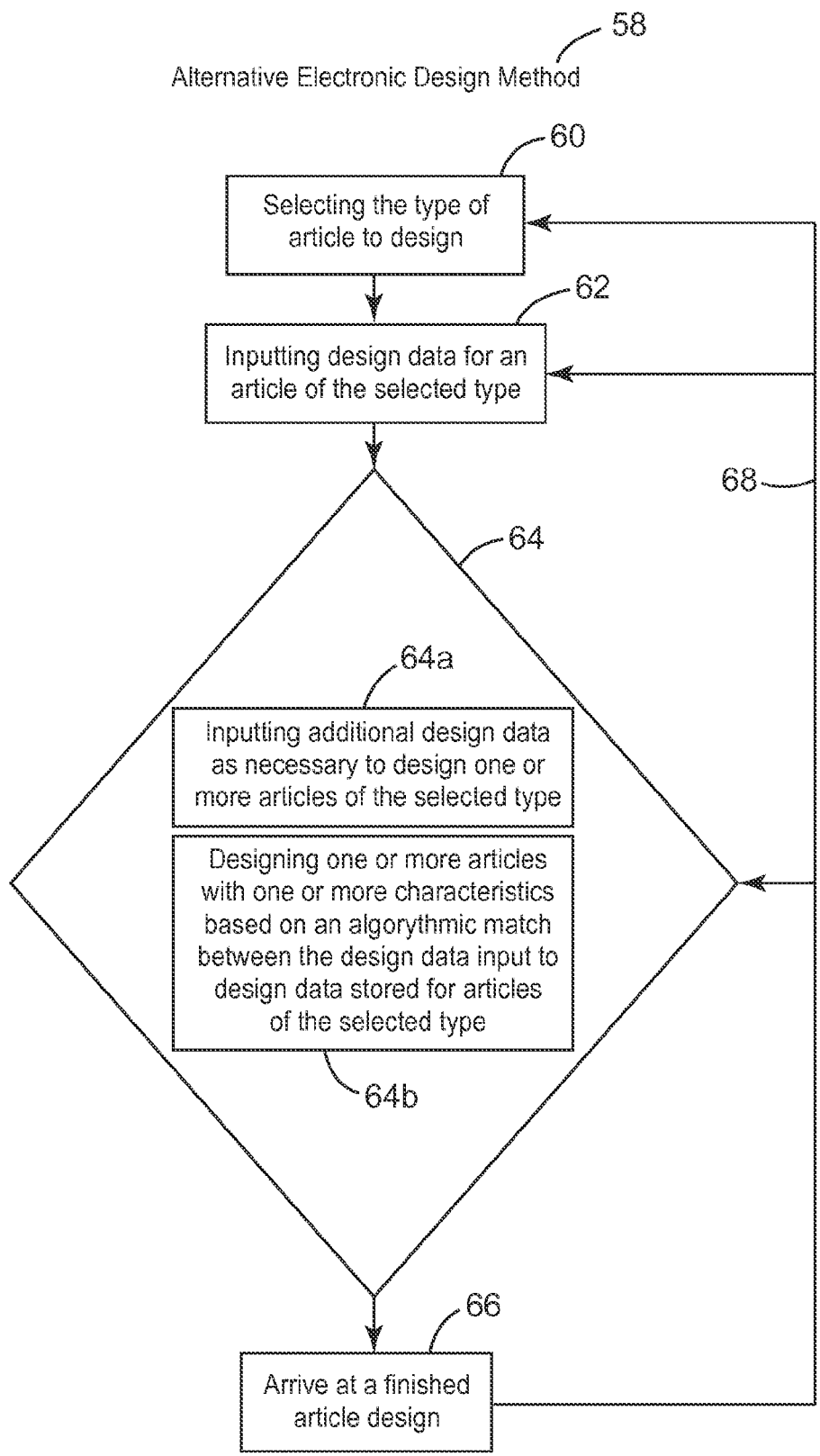
FIG. 9 shows an alternative method of electronically designing an article.

FIG. 9 shows an alternative electronic design method (58), which includes selecting the type of article to design (60), inputting design data for the article type selected (62), and automatically designing one or more articles (64). The method (58) begins by selecting the type of article to design (60). For example, a high-speed cable assembly could be the type of article selected for design from a static list of article types. The method (58) continues by inputting design data for an article of the selected type (62). Design data is input by manually entering data through menu selections, keyboard entries, mouse clicks, voice commands, etc. or by electronically importing data from another source. The design data input includes performance results and/or characteristics of the article. After inputting design data (62), the electronic design method (58) continues by automatically designing one or more articles (64). Automatically designing one or more articles (64) includes inputting additional design data as necessary to design one or more articles of the selected type (64*a*). The additional design data input (64*a*) is automatically presented based on the article type selected and the design data already input. Automatically designing one or more articles (64) also includes designing one or more articles with one or more characteristics based on an algorithmic match between the design data input and design data stored for a group of articles of the selected type (64*b*). The method (58) concludes by arriving at a finished article design (66), which is selected from the one or more articles automatically designed (64). A feedback loop (68) enables the selection step (60), the input step (62), and the design step (64) to be repeated as necessary to arrive at multiple article designs, to refine a single article design based on input design data, or to arrive at an article design that is a best fit or closest match to the design data input.

Figure 10:
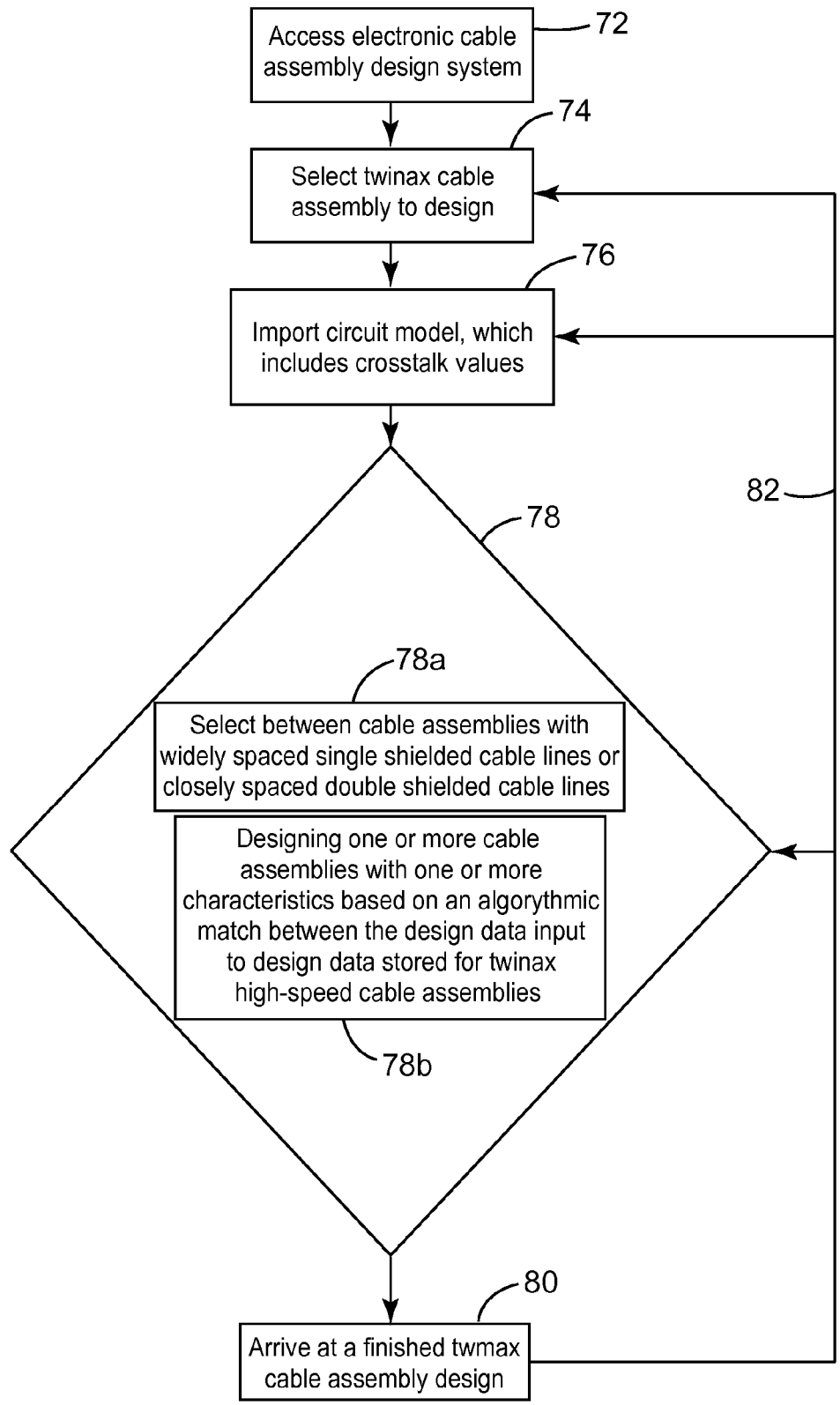
FIG. 10 shows an electronic high-speed cable assembly design system employing the method of FIG. 9.

FIG. 10 shows one example of the electronic design method of FIG. 9 in which the method (58) is employed in an electronic cable assembly design system (70). A user of the electronic design system (70) begins by accessing the electronic design system (72). The system (70) presents the user with a menu of different cable assembly types from which to choose. The user selects the type of cable assembly to design (74). For example, the user selects twinax high-speed as the cable assembly type. After selecting a cable assembly type, the user inputs design data for a twinax high-speed cable assembly (76). An example design data input might be crosstalk. Crosstalk is often measured on a quiet cable line next to a driven line and is also measured on a group of quiet lines sequentially next to the driven line. In the example shown in FIG. 10, the user electronically imports a circuit model previously obtained from another source, which includes crosstalk values for several quiet lines with respect to one driven line in a cable assembly. The system (70) automatically presents the user with additional inputs required to design one or more cable assemblies exhibiting the input crosstalk values (78*a*). For example, the user is prompted to select between cable assemblies with widely spaced single shielded cable lines or closely spaced double shielded cable lines. The system (70) then designs one or more cable assemblies with one or more characteristics based on an algorithmic match between the design data input by the user and design data stored in the system (70) for twinax high-speed cable assemblies (78*b*). In the design step (78*b*), the system (70) automatically compares the input design data to stored design data to configure one or more cable assembly designs that match the input design data. The system (70) then presents the user with the one or more twinax cable assembly designs matching the input design data and the degree to which the one or more cable assemblies match the input design data. The user arrives at a finished cable assembly design (80) by selecting from the one or more designs presented by the system (70). A feedback loop (82) enables the selection step (74), the input step (76), and the design steps (78*a*, 78*b*) to be repeated as necessary to arrive at multiple high-speed cable assembly designs, to refine a single design based on input design data, or to arrive at a cable assembly design that is a best fit or closest match to the design data input.

Figure 11:
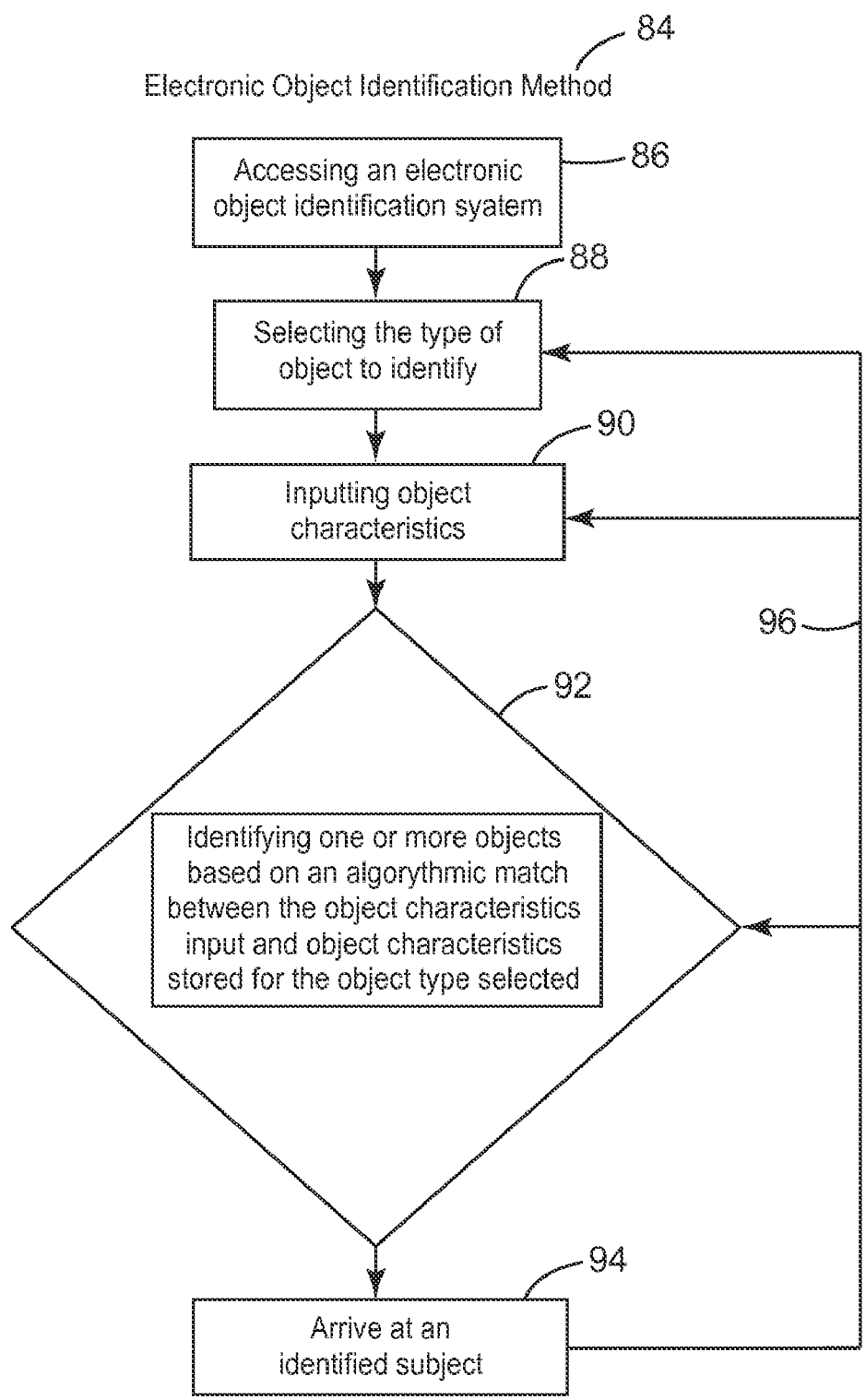
FIG. 11 shows a method of electronically identifying an object.

Embodiments according to the present invention may also be adapted to electronically identify an object or concept. FIG. 11 shows an electronic object identification method (84), which includes accessing an electronic object identification system (86), selecting the type of object to identify (88), inputting object characteristics (90), and identifying one or more objects based on an algorithmic match between the object characteristics input and object characteristics stored (92). In the electronic object identification method (84), a user accesses the identification system (86) and selects the type of object to identify (88). For example, the user selects birds as the type of object to identify. Persons having ordinary skill in the art will understand that the types of objects available may include a variety of examples, such as identifying naval airplane models and characteristics for the purposes of electronic military training, or many others.

Next, the user inputs object characteristics (90), such as importing a recording of bird song. Inputting object characteristics (90) is accomplished by manually entering object characteristics through menu selections, keyboard entries, mouse clicks, voice commands, etc. or by electronically importing the characteristics, such as the imported bird song. In the case where the user manually enters object characteristics, the system presents the user with the types of object characteristics available for identifying the selected object. For example the system presents the user with bird characteristics including: physical attributes, such as wing shape, tail shape, beak shape, feather coloration, egg coloration; habitat, such as geographic area or terrain; audio, such as voice or wing beats; and video, including speed or wing motion. The user selects physical attributes and habitat and enters the wingspan of the bird and river valleys for the habitat. The identification method (84) then identifies one or more objects based on an algorithmic match between the object characteristics input and object characteristics stored for objects of the type selected (92). For example, the system performs an algorithmic match between the recorded bird song imported by the user and bird songs stored in the system. Based on the algorithmic match, the system identifies two birds with bird songs similar to the recorded bird song input by the user. The system can optionally store object characteristics input by the user, thereby adding to and/or improving the system's capability to identify objects. In this case, the system algorithmically analyzes the quality of object characteristics input by the user before storing the input data. Additionally, the system compares the object characteristics input to object characteristics stored and based on the comparison optionally deletes the stored characteristics and replaces them with the characteristics input by the user. Storing the input data in the system includes adding the input data to a relational database, storing graphic files, and even revising solution algorithms used by the system that depend on stored design data. The object identification method (84) can also include requesting permission to retain user data or enabling the user to decide if and how the input data is used to update the system.

The user may refine the identification by inputting, either by manually entering or electronically importing, additional bird characteristics. For example, the system displays wing shapes for the two previously identified birds. The user selects the wing shape. The system then displays wingspan for user selection. The user selects a wingspan of six feet. The system identifies a single bird matching the imported bird song, the selected wing shape, and a wingspan of six feet and the method (84) concludes by arriving at an identified object (94), in this example the bird. A feedback loop (96) enables the selection step (88), the input step (90), and the identification step (92) to be repeated as necessary to identify multiple objects or to refine the identification of a single object.

Persons having ordinary skill in the art will understand that embodiments of the present invention may be practiced on a variety of electronic systems. The system employing methods of the present invention may be stored and processed locally on a single computer, or may be distributed across a communications network with components of the system stored and processed on a server and other components stored and processed on a client. In a client-server environment, the system may be distributed across a public network, such as the Internet, or across a private corporate network, such as a Local Area Network (LAN). Software programs used in systems employing methods of the present invention may include one or more programming languages and technologies and interact with off-the-shelf or proprietary relational databases or other data storage and retrieval mechanisms.

Although the present invention has been described with reference to preferred embodiments, workers skilled in the art will recognize that changes may be made in form and detail without departing from the spirit and scope of the invention.

The invention claimed is:

1. A computer implemented method of electronically designing an article, the method comprising:
   receiving a first selection input indicative of an article type to design;
   iteratively configuring a group of characteristics by receiving a second selection input indicative of one or more options for each characteristic and iteratively modeling the article performance based on a received third selection input indicative of one or more performance parameters for each performance model;
   automatically presenting the characteristics and the performance models based on the article type to design;
   dynamically updating a representation of the article for each step of the iterative configuration and/or modeled performance;
   automatically resolving conflicts between iteratively configured characteristics, between iteratively modeled performances, and across iteratively configured characteristics and modeled performances;
   comparing input characteristics and/or input performances with iteratively configured characteristics and/or iteratively modeled performances, respectively; and
   selectively storing and using the input characteristics and/or input performances to improve the method of electronically designing an article.

2. The electronic design method of claim 1, wherein iteratively configuring a group of characteristics further comprises:
   (a) configuring a characteristic for the article by receiving a second selection input indicative of one or more options;
   (b) adjusting remaining characteristics based on the article configured with the characteristic; and
   (c) iteratively repeating steps (a) and (b) until all characteristics have been configured for the article.

3. The electronic design method of claim 1, wherein iteratively modeling the article performance further comprises:
   (a) modeling the article performance by receiving a third selection input indicative of one or more performance parameters;
   (b) adjusting remaining performance models based on the article performance modeled; and
   (c) iteratively repeating steps (a) and (b) as necessary to complete the article design.

4. The electronic design method of claim 1 further comprising:
   graphically presenting the article for each iteratively configured characteristic and modeled performance.

5. The electronic design method of claim 1 further comprising:
   presenting a dynamically updated alphanumeric article identifier based on the article configured with the group of characteristics.

6. The electronic design method of claim 1 further comprising:
   outputting electronic information related to the article design.

7. The electronic design method of claim 6, wherein outputting electronic information related to the article design further comprises outputting one or more performance results for each iteratively modeled performance.

8. The electronic design method of claim 7 further comprising:
   outputting a first performance results;
   outputting a second performance results; and
   comparing the second performance results to the first performance results.

9. The electronic design method of claim 7 further comprising:
   translating the one or more performance results to an alternative data format chosen from a group of data formats; and
   outputting the one or more translated performance results.

10. A computer implemented method of electronically designing a cable assembly, the method comprising:
    receiving a first selection input indicative of a cable assembly type to design;
    iteratively configuring a group of characteristics by receiving a second selection input indicative of one or more options for each characteristic and iteratively modeling the cable assembly performance based on a received third selection input indicative of one or more performance parameters for each performance model;
    automatically presenting the characteristics and the performance models based on the cable assembly type to design;
    dynamically updating a representation of the cable assembly for each step of the iterative configuration and/or modeled performance;
    automatically resolving conflicts between iteratively configured characteristics, between iteratively modeled performances, and across iteratively configured characteristics and modeled performances;
    comparing input characteristics and/or input performances with iteratively configured characteristics and/or iteratively modeled performances, respectively; and
    selectively storing and using the input characteristics and/or input performances to improve the method of electronically designing a cable assembly.

11. The electronic design method of claim 10, wherein iteratively configuring a group of characteristics further comprises:
    (a) configuring a characteristic for the cable assembly by receiving a second selection input indicative of one or more options;
    (b) adjusting remaining characteristics based on the cable assembly configured with the characteristic; and (c) iteratively repeating steps (a) and (b) until all characteristics have been configured for the cable assembly.

12. The electronic design method of claim 10, wherein iteratively modeling the cable assembly performance further comprises:
- (a) modeling the cable assembly performance by receiving a third selection input indicative of one or more performance parameters;
- (b) adjusting remaining performance models based on the cable assembly performance modeled; and
- (c) iteratively repeating steps (a) and (b) as necessary to complete the cable assembly design.

13. The electronic design method of claim 10 further comprising:
graphically presenting the cable assembly for each iteratively configured characteristic and modeled performance.

14. The electronic design method of claim 10 further comprising:
presenting a dynamically updated alphanumeric cable assembly identifier based on the cable assembly configured with the group of characteristics.

15. The electronic design method of claim 10 further comprising:
outputting electronic information related to the cable assembly design.

16. The electronic design method of claim 15, wherein outputting electronic information related to the cable assembly design further comprises outputting one or more performance results for each iteratively modeled performance.

17. The electronic design method of claim 16 further comprising:
outputting a first performance results;
outputting a second performance results; and
comparing the second performance results to the first performance results.

18. The electronic design method of claim 16 further comprising:
translating the one or more performance results to an alternative data format chosen from a group of data formats; and
outputting the one or more translated performance results.

* * * * *

UNITED STATES PATENT AND TRADEMARK OFFICE
CERTIFICATE OF CORRECTION

PATENT NO. : 8,069,016 B2
APPLICATION NO. : 11/567035
DATED : November 29, 2011
INVENTOR(S) : Steven Feldman et al.

It is certified that error appears in the above-identified patent and that said Letters Patent is hereby corrected as shown below:

<u>Columns 2-3</u>
Lines 65-67 (Col. 2) and Lines 1-3 (Col. 3), delete "Design data: one or more variables used to define, partially or completely, a finished design, including characteristics and performance results. For example, design data for a cable assembly could include cable length, system impedance, and eye diagram results." and insert the same on Col. 2, Line 66 as a new paragraph.

Signed and Sealed this
Twelfth Day of June, 2012

David J. Kappos
*Director of the United States Patent and Trademark Office*